(12) United States Patent
Faue et al.

(10) Patent No.: US 7,218,564 B2
(45) Date of Patent: May 15, 2007

(54) DUAL EQUALIZATION DEVICES FOR LONG DATA LINE PAIRS

(75) Inventors: Jon Allan Faue, Colorado Springs, CO (US); John D. Heightley, Colorado Springs, CO (US)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/893,783

(22) Filed: Jul. 16, 2004

(65) Prior Publication Data

US 2006/0023529 A1   Feb. 2, 2006

(51) Int. Cl.
*G11C 7/00* (2006.01)

(52) U.S. Cl. .................. 365/204; 365/202; 365/204; 365/51; 365/205

(58) Field of Classification Search ........... 365/204, 365/202, 203, 205, 206, 207, 51
See application file for complete search history.

(56) References Cited

U.S. PATENT DOCUMENTS

| | | | | |
|---|---|---|---|---|
| 4,845,672 A * | 7/1989 | Watanabe et al. | ........... | 365/190 |
| 5,043,945 A * | 8/1991 | Bader | ......................... | 365/190 |
| 5,349,560 A * | 9/1994 | Suh et al. | ................... | 365/203 |
| 5,371,716 A * | 12/1994 | Yamanaka | ............... | 365/233.5 |
| 5,477,496 A * | 12/1995 | Tanaka et al. | .............. | 365/203 |
| 5,499,216 A * | 3/1996 | Yamamoto | ............. | 365/230.03 |
| 5,511,030 A * | 4/1996 | Tanaka et al. | .............. | 365/203 |
| 5,537,346 A * | 7/1996 | Seo et al. | ...................... | 365/51 |
| 5,623,446 A * | 4/1997 | Hisada et al. | .......... | 365/189.11 |
| 5,673,219 A * | 9/1997 | Hashimoto | .................. | 365/149 |
| 5,691,933 A * | 11/1997 | Takenaka | ..................... | 365/63 |
| 5,717,645 A * | 2/1998 | Kengeri et al. | ........ | 365/230.01 |
| RE36,169 E * | 3/1999 | Furutani | ...................... | 365/51 |
| 6,064,612 A * | 5/2000 | Agata | .......................... | 365/207 |
| 6,166,976 A * | 12/2000 | Ong | ............................ | 365/203 |
| 6,307,768 B1 * | 10/2001 | Zimmermann | ................ | 365/51 |
| 6,392,939 B1 * | 5/2002 | Hikiyama et al. | .......... | 365/201 |
| 6,636,453 B2 * | 10/2003 | Fischer et al. | ........ | 365/230.03 |
| 6,785,176 B2 * | 8/2004 | Demone | ..................... | 365/202 |
| 6,838,337 B2 * | 1/2005 | Schreck | ...................... | 438/253 |
| 6,876,584 B2 * | 4/2005 | Kwon | .................... | 365/189.01 |
| 6,928,012 B2 * | 8/2005 | Camacho et al. | ........... | 365/203 |
| 6,947,344 B2 * | 9/2005 | Suh | ............................. | 365/205 |
| 2004/0264272 A1 * | 12/2004 | Demone | ..................... | 365/202 |

FOREIGN PATENT DOCUMENTS

JP        411176151 A  *  7/1999

* cited by examiner

*Primary Examiner*—Viet Q. Nguyen
(74) *Attorney, Agent, or Firm*—Peter J. Meza; William J. Kubida; Hogan & Hartson LLP

(57) ABSTRACT

An equalization circuit for a pair of resistive-capacitive data lines includes primary and secondary equalization circuits attached at both ends of the data line pair. A primary equalization circuit at one end of the data line pair receives a primary control signal, and a secondary equalization circuit at the other end of the data line pair receives a secondary control signal, which is different than the primary control signal. The equalization devices in the primary equalization circuit are attached near the read and write amplifiers and operate normally since all the information is available as to whether or not the corresponding data line pair should be equalized. The additional equalization devices in the secondary equalization circuit placed at the other end of the data line pair receive a simpler control signal that lacks the information as to whether or not any particular data line pair is being equalized.

20 Claims, 3 Drawing Sheets

DUAL EQUALIZATION DEVICES FOR LONG DATA LINE PAIRS

BACKGROUND OF THE INVENTION

The present invention relates, in general, to the field of equalization of data line pairs in an integrated circuit memory. More particularly, the present invention relates to a method of equalizing extremely long data line pairs in which the distributed resistance and capacitance thereof adversely affects rapid and complete equalization.

Referring now to FIG. 1, a portion of an integrated circuit memory 100 includes a data amplifier 100 for driving a resistive-capacitive data line pair 14, 16. An equalization circuit 12 is used to equalize lines 14 and 16 to an intermediate voltage $V_{EQ}$, as is known in the art.

Each pair of data lines 14, 16 typically only has one equalization location ("EQ"), as shown in FIG. 1. Referring to FIG. 2, there are typically three devices (M1, M2, and M3) in equalization circuit 12, but they are all attached to the data line pair 14, 16 at roughly the same physical location. This is because the information needed to fully EQ or sense the data line pair is also usually available only at that same location. Furthermore, this is usually the end of data line pair 14, 16. Transistor M1 is used to provide the $V_{EQ}$ voltage to line 14, transistor M3 is used to provide the $V_{EQ}$ voltage to line 16, and transistor M2 is used short out lines 14 and 16 to remove any small voltage difference between the two lines. The "EQ" control signal is used to initiate equalization. The actual "EQ" control signal bus is coupled to the gates of P-channel transistors M1, M2, and M3, and is typically only available at one end of the integrated circuit.

Problems with equalization are encountered due to ever-lengthening data lines as memory size and performance demands increase. In modern integrated circuit memory devices, performing the EQ operation from only one end of the data line pair is very inefficient. At the EQ circuit location, the data line pair equalizes very rapidly, but due to resistive-capacitive ("RC") delays, the far side of the data line pair lags far behind and is very slow to EQ. The problem of inefficient equalization is further exacerbated since the EQ devices substantially turn off once the data line pair is equalized at the point of attachment and no further power is applied. Thus, when the near end gets close to the EQ state, the VDS of the P-channel EQ devices is close to zero, and so no more charge is put into the data lines to continue the EQ process.

What is desired is a circuit and method for quickly and efficiently equalizing data line pairs in an integrated circuit memory or other circuit, so that the adverse affects of distributed resistance and capacitance in long data lines can be overcome.

SUMMARY OF THE INVENTION

In accordance with an embodiment of the present invention, an equalization circuit is disclosed which enables a data line pair to be quickly and efficiently equalized. In a particular embodiment thereof, EQ devices are attached at both ends of a data line pair, and the EQ operation is completed substantially four times faster than if EQ devices are attached at only one end of the data line pair.

According to an embodiment of the present invention, EQ circuits are attached at both ends of the data-line pair. A primary EQ circuit at one end of the data line pair receives a primary control signal, and a secondary EQ circuit at the other end of the data line pair receives a secondary control signal, which is different than the primary control signal. The EQ devices in the primary EQ circuit attached near the read and write amplifiers work as normal since all the information is available as to whether or not the corresponding data line pair should be equalized. The additional EQ devices in the secondary EQ circuit placed at the other end of the data line pair receive a simpler control signal that lacks the information as to whether or not any particular data line pair is being equalized.

The equalization circuit of the present invention is designed for use in an integrated circuit memory such as a DRAM, but it can be used in any memory application in which long data-line pairs are used in a "sense/equilibrate" sequence.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 3:
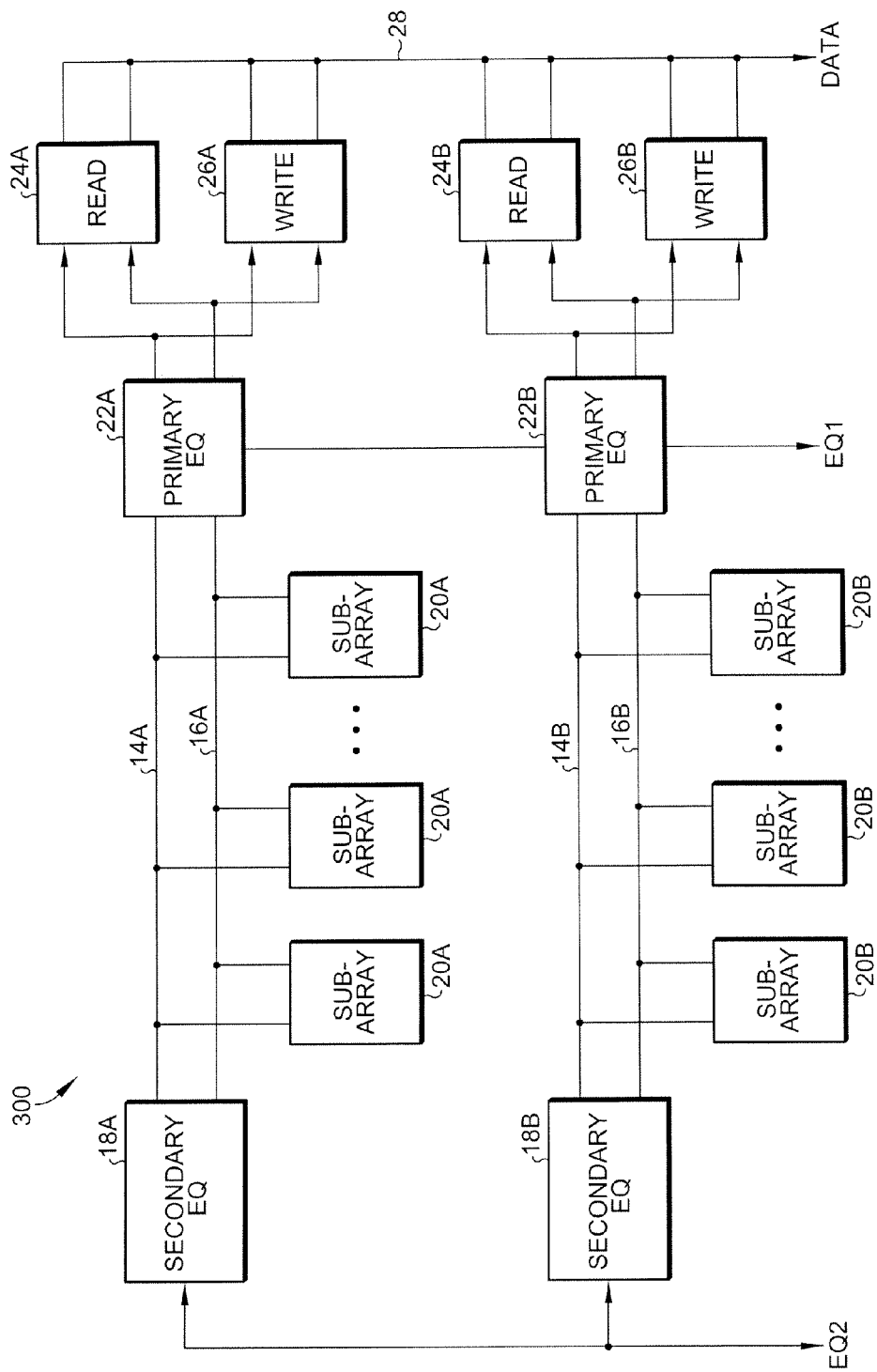
FIG. 3 is a schematic diagram of an equalization circuit according to an embodiment of the present invention.

Referring now to FIG. 3, an integrated circuit memory 300 includes equalization circuitry according to an embodiment of the present invention, including two data line pairs 14A, 16A and 14B, 16B to be equalized. While only two data line pairs are shown in FIG. 3, it is apparent to those having skill in the art that any number of data line pairs may be present in an integrated circuit memory or other integrated circuit. A corresponding number of first equalization circuits 22A and 22B are coupled to a first end of each associated data line pair. In FIG. 3, two first equalization circuits are shown, but any number of such circuits can be provided to accommodate the number of data line pairs present. A corresponding number of read amplifiers 24A, 24B and a corresponding number of write amplifiers 26A, 26B are associated with each of the first equalization circuits 22A, 22B. A data bus 28 is coupled to each of the read 24A, 24B and write 26A, 26B amplifiers. A corresponding number of second equalization circuits 18A, 18B are coupled to a second end of each data line pair. A number of memory subarrays 20A, 20B are coupled to each data line pair as shown in FIG. 3. The actual number of memory subarrays is determined only by the designer's choice to accommodate a specific application or set of performance objectives.

Each of the first equalization circuits 22A, 22B each receive a first equalization control signal EQ1 that contains information as to which of the plurality of data line pairs is being accessed. Each of the second equalization circuits 18A, 18B receive a second equalization control signal EQ2 that does not contain any information as to which of the plurality of data line pairs is being accessed.

Figure 1:
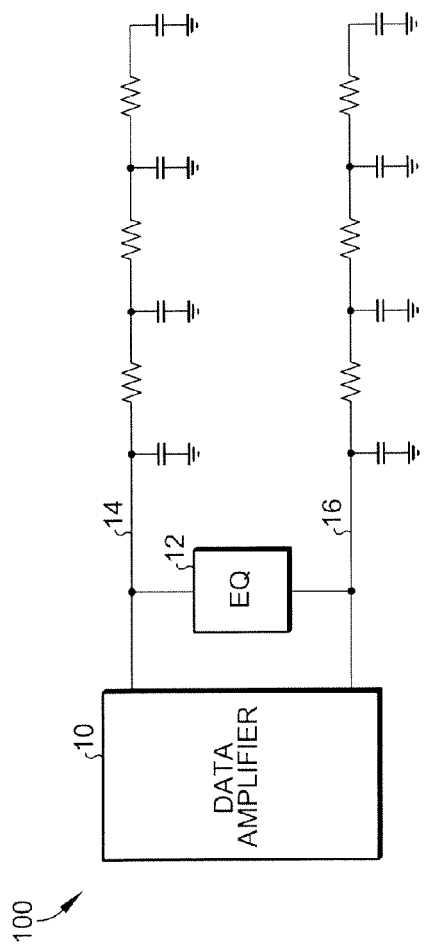
FIG. 1 is a schematic/block diagram of a portion of an integrated circuit memory including a data amplifier, equalization circuit, and a pair of resistive-capacitive data lines as is known in the art.
Figure 2:
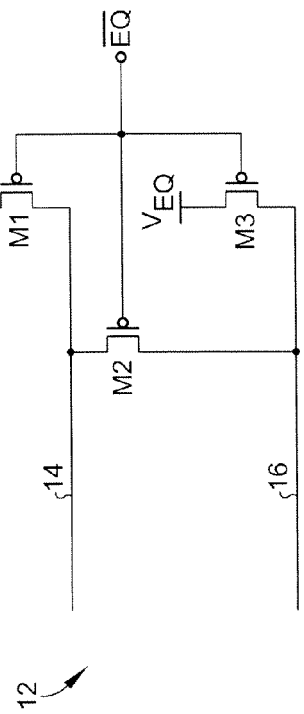
FIG. 2 is a schematic diagram of a typical equalization circuit for use in the integrated circuit memory of FIG. 1.

The first equalization circuit includes a P-channel transistor M2 having a current path coupled between each line in a respective line pair as shown in FIG. 2. Transistor M2 is optional in the second equalization circuit. Each of the first and second equalization circuits also includes a first P-channel transistor M1 coupled to a first line in a respective line pair, and a second P-channel transistor M3 coupled to a second line in a respective line pair, for providing an equalization voltage $V_{EQ}$ to the first and second lines. While P-channel transistors are shown, it is apparent to those of skill in the art that N-channel transistors can be used, as long as the polarity of the EQ signal is reversed. A combination of N-channel and P-channel transistors could also be used.

In operation, the equalization circuitry of an embodiment of the present invention equalizes a first end of the pair of resistive-capacitive data lines 14, 16 under control of the first control signal EQ1 and equalizes a second end of the pair of resistive-capacitive data lines 14, 16 under control of the second control signal EQ2.

The EQ2 control signal at the far end of the data line pair has no information as to which data line pairs are actually being accessed or not. In operation, therefore, the additional EQ devices are turned off whenever any data line pair might be accessed. The primary EQ devices at the read and write amplifier end always keep an unaccessed data line pair in the EQ state.

The EQ circuitry at the far end of the data line pair only needs information as to whether or not any data line pair in the subarray is not in the EQ situation (i.e. YCLK="1"). The YCLK signal is an internal clock signal associated with column address timing. When YCLK is high (logic one state or simply "1") a sense amplifier in the memory array is being accessed for either read or write purposes. During this time, that particular data line pair cannot remain in the EQ state because a differential voltage must be developed thereon. Any time YCLK="1", the "far end" equalization devices turn off and do not EQ the attached data line pair. If a pair is not accessed by that particular YCLK event and should remain in the EQ state, the original EQ devices at the read and write amplifier end remain on and the data line pair remains equalized. Two EQ circuits according to an embodiment of the present invention are needed to perform the equalization task in a short period of time if a read or write operation has just separated a data line pair, but only one EQ circuit is required for a data line pair to just remain in an equalization state.

An extra set of EQ devices is thus placed at the far end of the data line pair, which is controlled by the secondary EQ signal, EQ2. The primary EQ1 signal contains embedded information such as a "bank" command, read/write command, and various column addresses. The EQ2 signal, however, lacks this embedded information. If YCLK is high, equalization does not take place. The data line pair 14, 16 stays in the EQ mode if that YCLK does not apply to the data line pair, because the "true" EQ device (controlled by EQ1) will remain in the EQ state.

Figure 4:
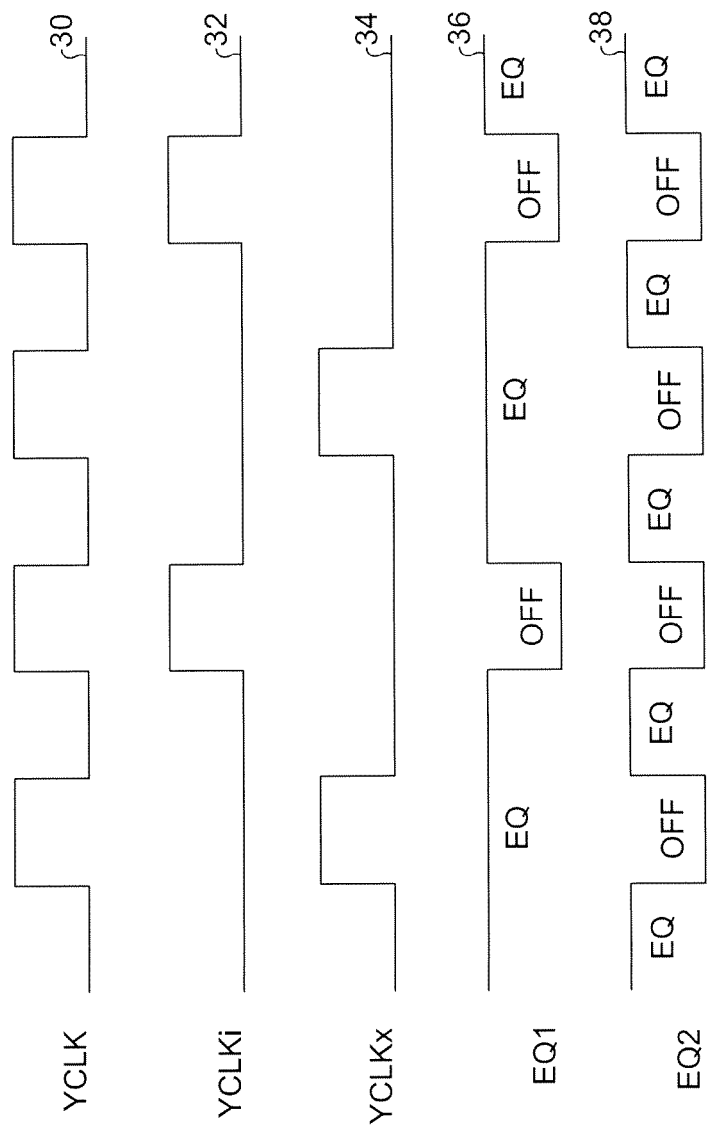
FIG. 4 is a timing diagram associated with equalization circuit of FIG. 3.

Referring now to the timing diagram of FIG. 4, the far side equalization circuit turns off every YCLK cycle, since no information is available on the far side of the memory subarray to know which YCLK cycle truly applies to the data line pair the EQ device is attached to. The following signals are shown in FIG. 4: YCLK, YCLK i, YCLK x, EQ1, and EQ2. YCLK is the internal clock signal as previously described. YCLK i is an internal clock signal associated with a line coupled to an equalization circuit receiving the YCLK signal. YCLK x is an internal clock signal associated with a different line coupled to another equalization circuit. EQ1 and EQ2 are the first and second equalization signals. As can be seen in FIG. 4, the EQ1 signal turns off whenever the corresponding "YCLK i" signal is received. However, the EQ2 signal turns off every time the master YCLK signal changes state.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

The invention claimed is:

1. An equalization circuit comprising:
   a pair of continuous lines to be equalized;
   a first equalization circuit coupled to the pair of lines at a first end thereof having an input for receiving a first equalization control signal; and
   a second equalization circuit coupled to the pair of lines at a second end thereof having an input for receiving a second equalization control signal.

2. The equalization circuit of claim 1 in which only the first equalization circuit is coupled to a read amplifier.

3. The equalization circuit of claim 1 in which only the first equalization circuit is coupled to a write amplifier.

4. The equalization circuit of claim 1 in which the pair of lines comprises a pair of complementary bit lines.

5. The equalization circuit of claim 1 further comprising a plurality of memory subarrays coupled to the pair of lines.

6. The equalization circuit of claim 1 in which the first equalization circuit comprises a P-channel transistor having a current path coupled between each line in the pair of lines.

7. The equalization circuit of claim 1 in which the first equalization circuit comprises a first P-channel transistor coupled to a first line of the pair of lines, and a second P-channel transistor coupled to a second line of the pair of lines, for providing an equalization voltage to the first and second lines.

8. The equalization circuit of claim 1 in which the second equalization circuit comprises a P-channel transistor having a current path coupled between each line in the pair of lines.

9. The equalization circuit of claim 1 in which the second equalization circuit comprises a first P-channel transistor coupled to a first line of the pair of lines, and a second P-channel transistor coupled to a second line of the pair of lines, for providing an equalization voltage to the first and second lines.

10. An integrated circuit memory comprising:
    a plurality of line pairs to be equalized;

a plurality of first equalization circuits coupled to a first end of each line pair;

a plurality of read amplifiers associated with each of the first equalization circuits;

a plurality of write amplifiers associated with each of the first equalization circuits;

a data bus coupled to the plurality of read and write amplifiers;

a plurality of second equalization circuits coupled to a second end of each line pair; and a plurality of memory subarrays coupled to each line pair.

11. The integrated circuit memory of claim 10 in which the plurality of first equalization circuits each receive a first equalization control signal.

12. The integrated circuit memory of claim 11 in which the first equalization control signal contains information as to which of the plurality of line pairs is being accessed.

13. The integrated circuit memory of claim 10 in which the plurality of second equalization circuits each receive a second equalization control signal.

14. The integrated circuit memory of claim 13 in which the second equalization control signal does not contain any information as to which of the plurality of line pairs is being accessed.

15. The equalization circuit of claim 10 in which each of the first equalization circuits comprises a P-channel transistor having a current path coupled between each line in a respective line pair.

16. The equalization circuit of claim 10 in which each of the first equalization circuits comprises a first P-channel transistor coupled to a first line in a respective line pair, and a second P-channel transistor coupled to a second line in a respective line pair, for providing an equalization voltage to the first and second lines.

17. The equalization circuit of claim 10 in which each of the second equalization circuits comprises a P-channel transistor having a current path coupled between each line in a respective line pair.

18. The equalization circuit of claim 10 in which each of the second equalization circuits comprises a first P-channel transistor coupled to a first line in a respective line pair, and a second P-channel transistor coupled to a second line in a respective line pair, for providing an equalization voltage to the first and second lines.

19. A method of equalizing a pair of continuous resistive-capacitive lines, the method comprising:

equalizing a first end of the pair of resistive-capacitive lines under control of a first control signal; and equalizing a second end of the pair of resistive-capacitive lines under control of a second control signal.

20. The method of claim 19 further comprising reading and writing data associated with the pair of resistive-capacitive lines using only the first end thereof.

* * * * *